(12) United States Patent
Murata et al.

(10) Patent No.: US 7,589,585 B2
(45) Date of Patent: Sep. 15, 2009

(54) NOISE REDUCTION CIRCUIT

(75) Inventors: Takahiko Murata, Osaka (JP); Takumi Yamaguchi, Kyoto (JP); Shinzo Koyama, Osaka (JP); Shigetaka Kasuga, Osaka (JP); Takayoshi Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 69 days.

(21) Appl. No.: 11/826,582

(22) Filed: Jul. 17, 2007

(65) Prior Publication Data

US 2008/0024206 A1   Jan. 31, 2008

(30) Foreign Application Priority Data

Jul. 31, 2006   (JP) .............................. 2006-207903

(51) Int. Cl.
*H03K 17/16* (2006.01)
*H03K 5/00* (2006.01)

(52) U.S. Cl. ...................... 327/551; 327/379; 348/619; 348/311

(58) Field of Classification Search .................. None
See application file for complete search history.

(56) References Cited

U.S. PATENT DOCUMENTS 4,306,203 A * 12/1981 Sasaki et al. ................. 333/173
7,002,404 B2 * 2/2006 Gaggl et al. ................. 327/553
RE40,249 E * 4/2008 Cannata et al. ............. 250/332
7,411,444 B2 * 8/2008 Muhammad et al. ........ 327/552
7,463,085 B2 * 12/2008 Kim et al. .................... 327/553

OTHER PUBLICATIONS

Fukinuki, T., "Digital Signal Processing of Images", May 25, 1981, pp. 114-117, Nikkan Kogyo Simbun Co., ltd.

* cited by examiner

*Primary Examiner*—Lincoln Donovan
*Assistant Examiner*—Terry L Englund
(74) *Attorney, Agent, or Firm*—McDermott Will & Emery LLP

(57) ABSTRACT

A noise reduction circuit outputs a signal corresponding to a voltage difference between two different signals. The noise reduction circuit includes: an amplifier circuit for amplifying the two different signals at different timings; and a voltage difference detection circuit for detecting a voltage difference between the two different signals amplified by the amplifier circuit. The noise reduction circuit accumulates, a predetermined number of times, an electric charge corresponding to the voltage difference detected by the voltage difference detection circuit and combines the accumulated electric charges to output a resultant electric charge.

1 Claim, 5 Drawing Sheets

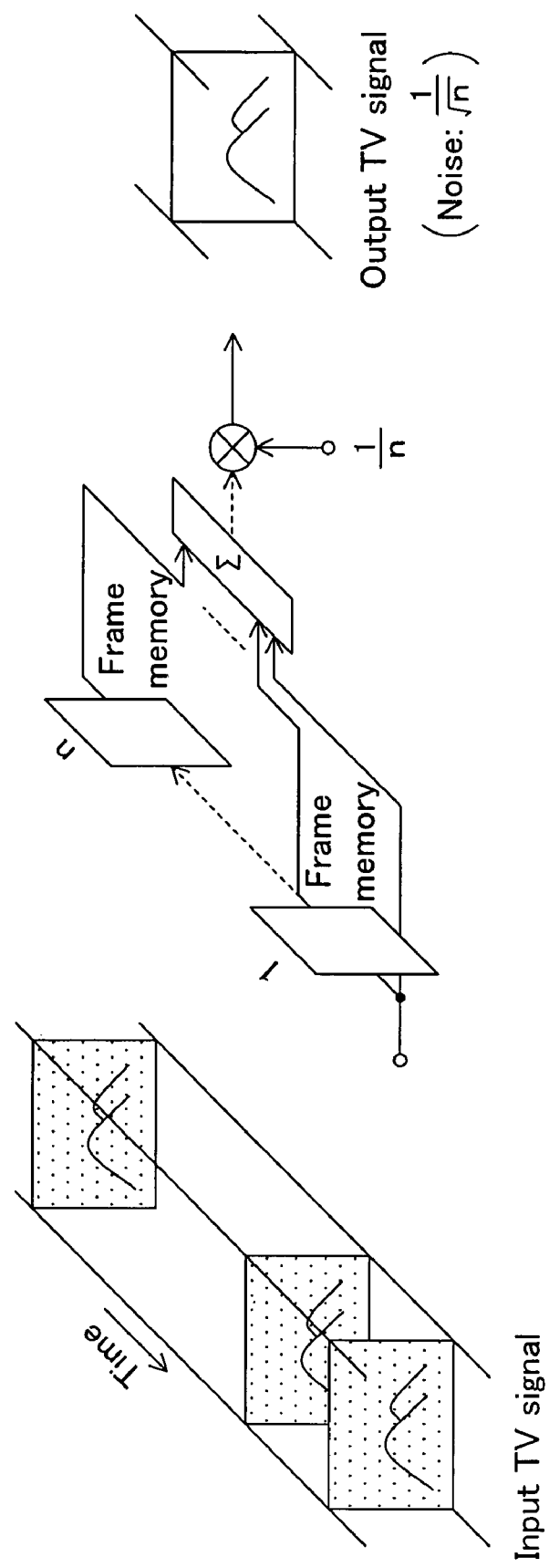

US 7,589,585 B2

NOISE REDUCTION CIRCUIT

BACKGROUND OF THE INVENTION

1. Field of the Invention

The present invention relates to noise reduction circuits for reducing noise contained in signals.

2. Description of the Related Art

A conventional noise reduction circuit having the following structure has been known (see Non-Patent Document 1).

FIGS. 5A to 5C are views for explaining the basic principle of conventional noise suppression. A plurality of image data sets (e.g., TV signals) shown in FIG. 5A are stored in frame memories shown in FIG. 5B, and an average for the n frames is calculated. For a signal component, if there is no variation among the frames, the original signal component value is output as the average value. For noise, on the other hand, since it is considered that there is no correlation among the frames, the average noise amplitude is attenuated to $1/n^{0.5}$ as shown in FIG. 5C.

[Non-Patent Document 1]

"7.3.3 image noise suppressing" in p. 115 in "Digital Signal Processing of Images" by Takahiko Fukinuki published by The Nikkan Kogyo Shimbun Co., Ltd.

SUMMARY OF THE INVENTION

However, in the conventional noise suppression, the expensive frame memories must be provided outside the noise reduction circuit.

In view of the above, it is therefore an object of the present invention to provide a noise reduction circuit capable of noise suppression without external expensive frame memories.

In order to achieve the object, a first inventive noise reduction circuit, which receives, as an input signal, a voltage difference between two different signals, includes: an amplifier circuit for amplifying the two different signals; a voltage difference detection circuit for detecting a voltage difference between the two different signals amplified by the amplifier circuit; and an electric charge accumulation circuit section for accumulating, a predetermined number of times, an electric charge corresponding to the voltage difference detected by the voltage difference detection circuit and combining the accumulated electric charges to output the resultant electric charge.

In the first inventive noise reduction circuit, for the signal component, the original value is output as the average value, while the noise is attenuated to $1/N^{0.5}$ (where N is the number of times the electric charge corresponding to the voltage difference between the two different signals is accumulated.) That is, the noise can be reduced without providing any external memories.

A second inventive noise reduction circuit, which receives, as an input signal, a voltage difference between two different signals, includes: an amplifier circuit for amplifying the two different signals; a voltage difference detection circuit for detecting a voltage difference between the two different signals amplified by the amplifier circuit; and a voltage adding circuit for adding, a predetermined number of times, the voltage difference detected by the voltage difference detection circuit.

In the second inventive noise reduction circuit, the signal component is increased by N times by the additions (where N is the number of times the voltage difference between the two different signals is added), while the noise is only $N^{0.5}$ times the original. That is, the noise can be substantially reduced without providing any external memories.

As described above, when applied to image processing and the like, the present invention, which relates to noise reduction circuits for reducing noise contained in signals, is very effective in significantly reducing noise contained in signals without providing any external memories.

BRIEF DESCRIPTION OF THE DRAWINGS

FIGS. 5A to 5C are views for explaining the basic principle of conventional noise suppression.

DETAILED DESCRIPTION OF THE INVENTION

First Embodiment

Figure 1:
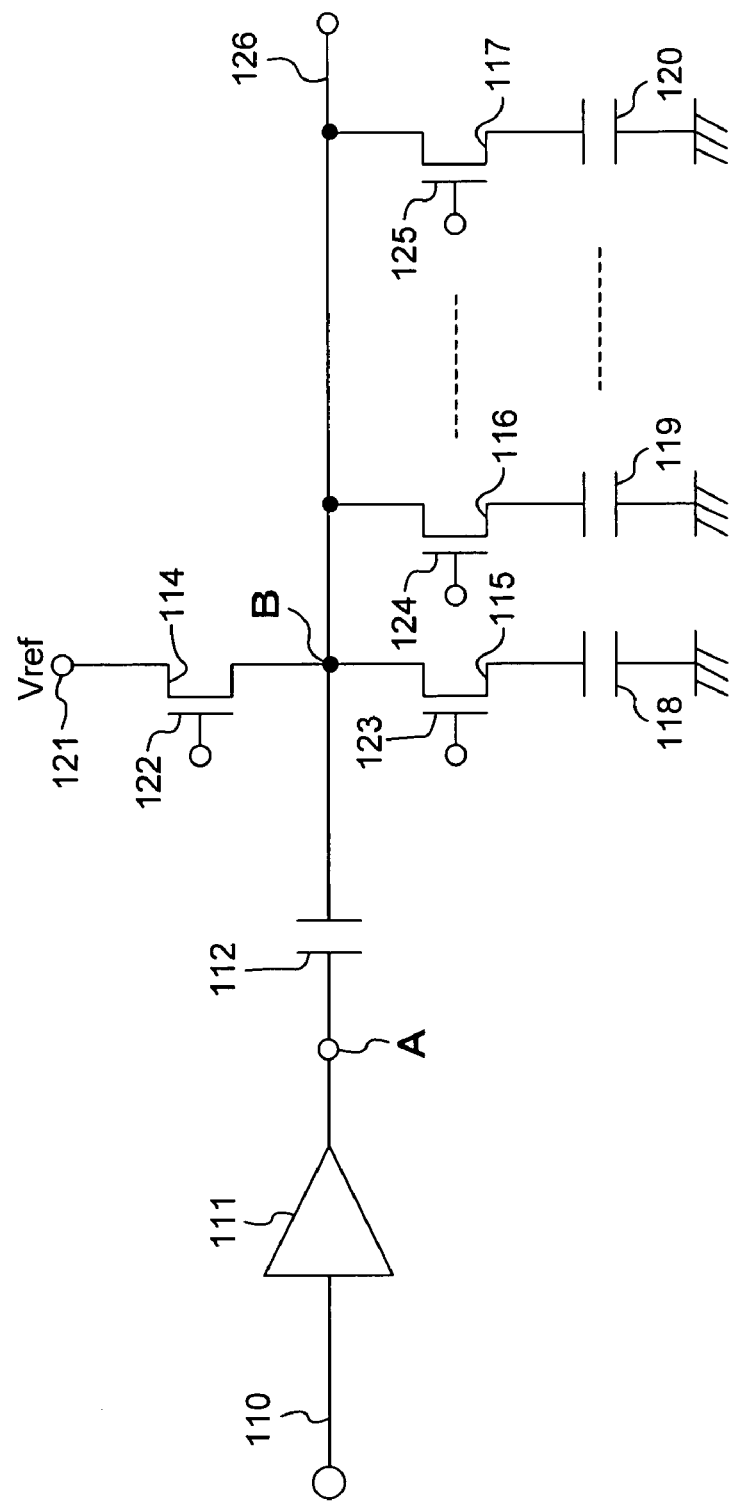
FIG. 1 shows the basic circuit configuration of a noise reduction circuit according to a first embodiment of the present invention.

Hereinafter, a noise reduction circuit according to a first embodiment of the present invention will be described with reference to the accompanying drawings. FIG. 1 shows the basic circuit configuration of the noise reduction circuit of this embodiment. As shown in FIG. 1, the input side of an amplifier circuit 111 is connected to a signal line 110, to which two different signals are alternately output. The amplifier circuit 111 amplifies the two different signals. The output terminal A of the amplifier circuit 111 is connected to a signal line 126 through a capacitor 112. One of the source and drain of a switch 114 (which is a MOS (metal oxide semiconductor) transistor, for example) is connected to a point B in the signal line 126. The other of the source and drain of the switch 114 is connected with a reference voltage source (Vref) 121. The reference numeral 122 denotes the gate terminal of the switch 114. One of the source and drain of a switch 115 (which is a MOS transistor, for example) is also connected to the point B in the signal line 126. The other of the source and drain of the switch 115 is grounded via a capacitor 118. The reference numeral 123 indicates the gate terminal of the switch 115. Furthermore, a plurality of switches 116, . . . and 117 (which are MOS transistors, for example) are provided opposite the amplifier circuit 111 with respect to the point B of the signal line 126, with one of the source and drain of each switch connected in parallel to the signal line 126. The other of the source and drain of each of the switches 116, . . . and 117 is grounded through an associated capacitor 119, . . . or 120. The reference numerals 124, . . . and 125 represent the gate terminals of the switches 116, . . . and 117.

In this embodiment, as will be described later, the capacitor 112 and the capacitors 118, 119, . . . and 120 form a voltage difference detection circuit. The voltage difference detection circuit detects a voltage difference between two different signals amplified by the amplifier circuit 111. The capacitors 118, 119, . . . and 120 also form an electric charge accumulation circuit section. The electric charge accumulation circuit section accumulates, a predetermined number of times, an electric charge corresponding to the voltage difference detected by the voltage difference detection circuit and combines the accumulated electric charges to output the resultant electric charge.

Figure 2:
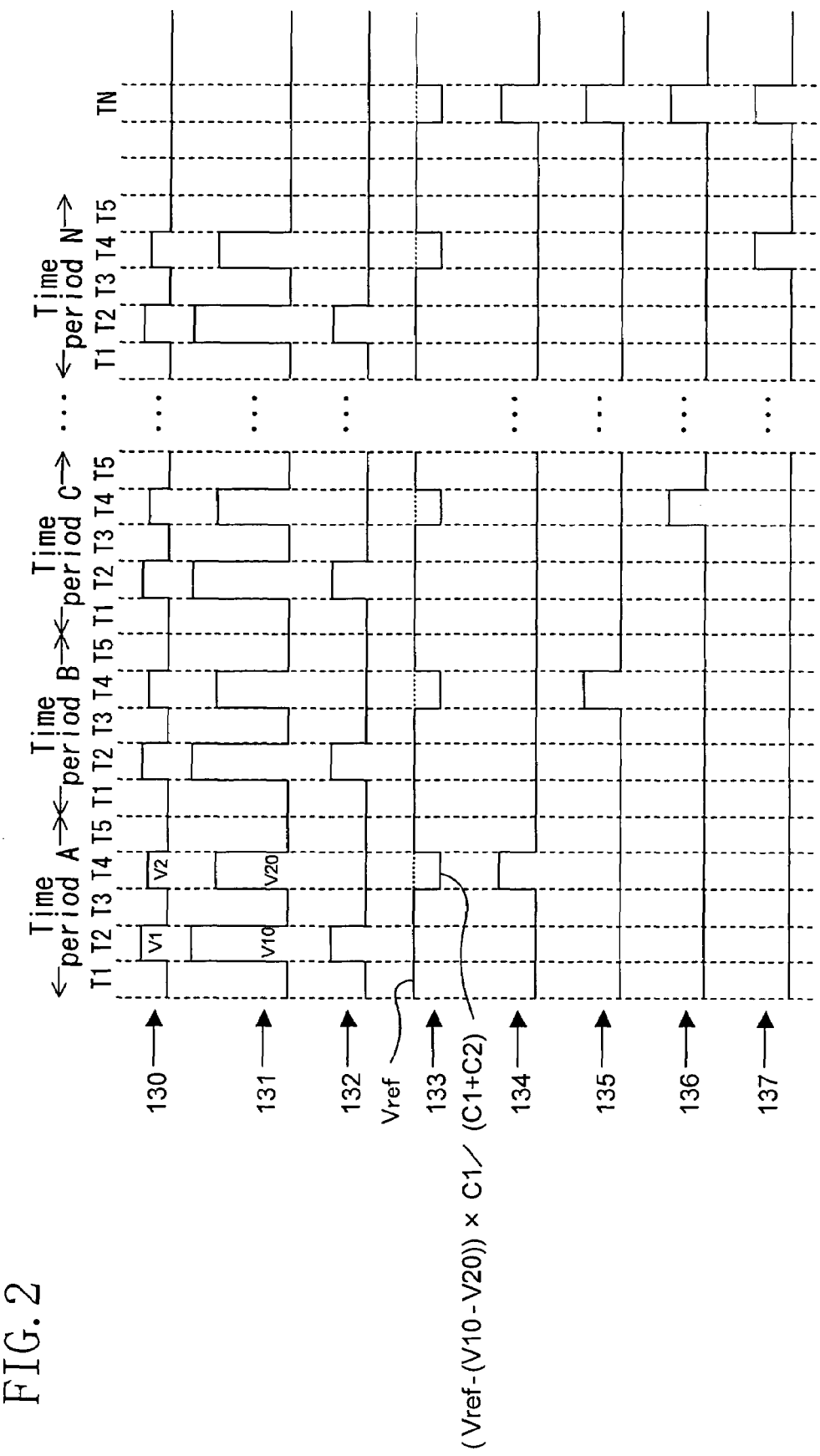
FIG. 2 shows timing for operating the noise reduction circuit according to the first embodiment of the present invention.

Hereinafter, it will be described how the noise reduction circuit of this embodiment operates. FIG. 2 shows timing for operating the noise reduction circuit of this embodiment. In FIG. 2, the reference numeral 130 represents the waveform of the signals output to the signal line 110; 131 represents the waveform of the signals (at the point A in FIG. 1) amplified by the amplifier circuit 111; 132 represents the waveform of a signal applied to the gate terminal 122 of the switch 114; 133 represents the waveform of the signals at the point B in FIG. 1; and 134, 135, . . . and 137 represent the respective waveforms of signals applied to the gate terminals 123, 124, . . . and 125 of the switches 115, 116, . . . and 117.

First, in T2 in a time period A, the reference voltage V1 of a signal (a first signal) output to the signal line 110 is amplified to a voltage V10 by the amplifier circuit 111 as shown in FIG. 2. At this time, since the gate terminal 122 of the switch 114 is at the HIGH level, the switch 114 is in the on state. Thus, the voltage at the point A is V10 and the voltage at the point B is Vref. Consequently, the capacitor 112 is charged with a voltage of (Vref-V10).

Next, in T4 in the time period A, the detected voltage V2 of a signal (a second signal) output to the signal line 110 is amplified to a voltage V20 by the amplifier circuit 111, which causes the voltage at the point A to change from V10 to V20. At this time, since the gate terminal 123 of the switch 115 is at the HIGH level, the switch 115 is in the on state, and the capacitors 112 and 118 are electrically connected. Thus, the voltage at the point B is $$(Vref-(V10-V20)) \times (C1/(C1+C2))$$

where C1 is the capacitance value of the capacitor 112 and C2 is the capacitance value of the capacitor 118. As a result, an electric charge corresponding to that voltage is stored in the capacitor 118 in T5 in the time period A.

Subsequently, similar operation is performed in time periods B, C, . . . and N, whereby an electric charge corresponding to a voltage difference (containing noise) between the reference voltage V1 and the detected voltage V2 is accumulated in each of the N capacitors 118, 119, . . . and 120.

Then, all of the gate terminals 123, 124, . . . and 125 of the switches 115, 116, . . . and 117 go to the HIGH level in a time interval TN, and all of the N capacitors 118, 119, . . . and 120 are thus parallel-connect. As a result, the electric charges respectively accumulated in the N capacitors 118, 119, . . . and 120 are averaged, and a signal corresponding to that averaged amount of electric charge is output to the signal line 126. At this time, the signal component of the signal output to the signal line 126 shows the average value of the signal components of the N capacitors 118, 119, . . . and 120 and does not change from the original signal component. On the other hand, the value of noise in the signal output to the signal line 126 is the root mean square value of noises in the N capacitors 118, 119, . . . and 120 (for example, the noise in the signal output to the signal line 126 is $(1/N \times ((Na)^2 + (Nb)^2 + \ldots + (Nn)^2))^{0.5}$, where Na, Nb, Nc, . . . and Nn are the noises in the N capacitors 118, 119, . . . and 120, respectively) and is therefore attenuated to be $1/N^{0.5}$ times the noise in the original signal (where N is the number of times the electric charge corresponding to the voltage difference between the two different signals is accumulated). That is, the S/N ratio substantially increases by $N^{0.5}$ times. For instance, when N=100, the S/N ratio increases by 10 times.

As described above, according to the first embodiment, it is possible to reduce the noise without any external memories.

Second Embodiment

Figure 3:
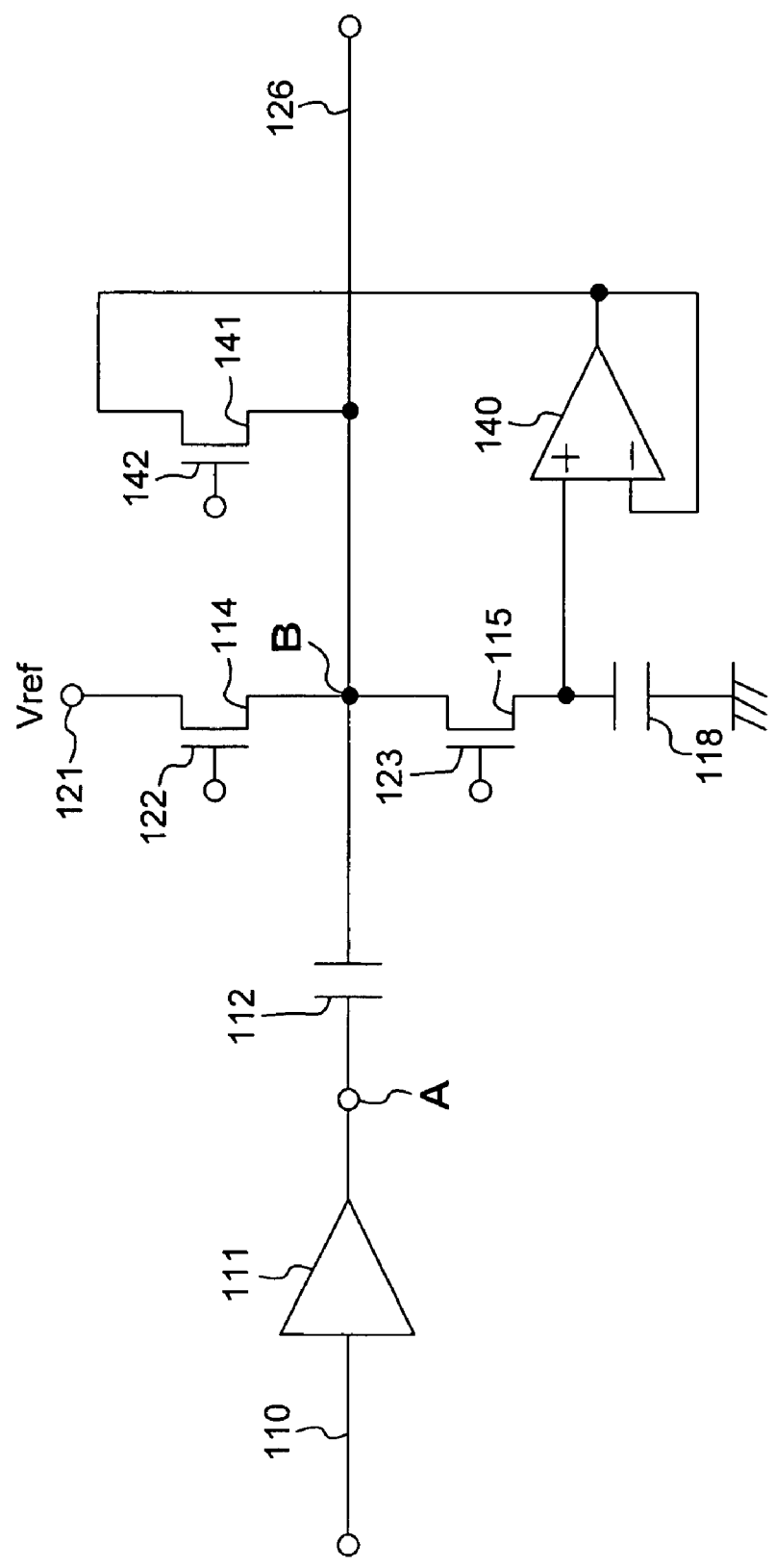
FIG. 3 shows the basic circuit configuration of a noise reduction circuit according to a second embodiment of the present invention.

Hereinafter, a noise reduction circuit according to a second embodiment of the present invention will be described with reference to the accompanying drawings. FIG. 3 shows the basic circuit configuration of the noise reduction circuit of this embodiment. As shown in FIG. 3, as in the first embodiment, the input side of an amplifier circuit 111 is connected to a signal line 110, to which two different signals are alternately output. The amplifier circuit 111 amplifies the two different signals. The output terminal A of the amplifier circuit 111 is connected to a signal line 126 through a capacitor 112. One of the source and drain of a switch 114 (which is a MOS transistor, for example) is connected to a point B in the signal line 126. The other of the source and drain of the switch 114 is connected with a reference voltage source (Vref) 121. The reference numeral 122 denotes the gate terminal of the switch 114. One of the source and drain of a switch 115 (which is a MOS transistor, for example) is also connected to the point B in the signal line 126. The other of the source and drain of the switch 115 is grounded via a capacitor 118. The reference numeral 123 indicates the gate terminal of the switch 115.

As shown in FIG. 3, the circuit configuration of this embodiment differs from that of the first embodiment in that the capacitor 118 is the only capacitor for accumulating an electric charge corresponding to a voltage difference between the two different signals and that the potential of the capacitor 118 (i.e., the potential at the side thereof connected to the switch 115) is sent back to the signal line 126, for example, through an operational amplifier 140 with a gain of 1 and through a switch 141, which is a MOS transistor. Specifically, the potential of the capacitor 118 is input to the positive-phase input terminal of the operational amplifier 140. The output terminal of the operational amplifier 140 is electrically connected with the negative-phase input terminal thereof and with one of the source and drain of the switch 141. The other of the source and drain of the switch 141 is connected with the signal line 126. The reference numeral 142 denotes the gate terminal of the switch 141.

In this embodiment, as will be described later, the capacitors 112 and 118 form a voltage difference detection circuit. The voltage difference detection circuit detects a voltage difference between two different signals amplified by the amplifier circuit 111. Also, the capacitor 118, the operational amplifier 140, and the switch 141 form a voltage adding circuit. The voltage adding circuit adds, a predetermined number of times, the voltage difference detected by the voltage difference detection circuit.

Figure 4:
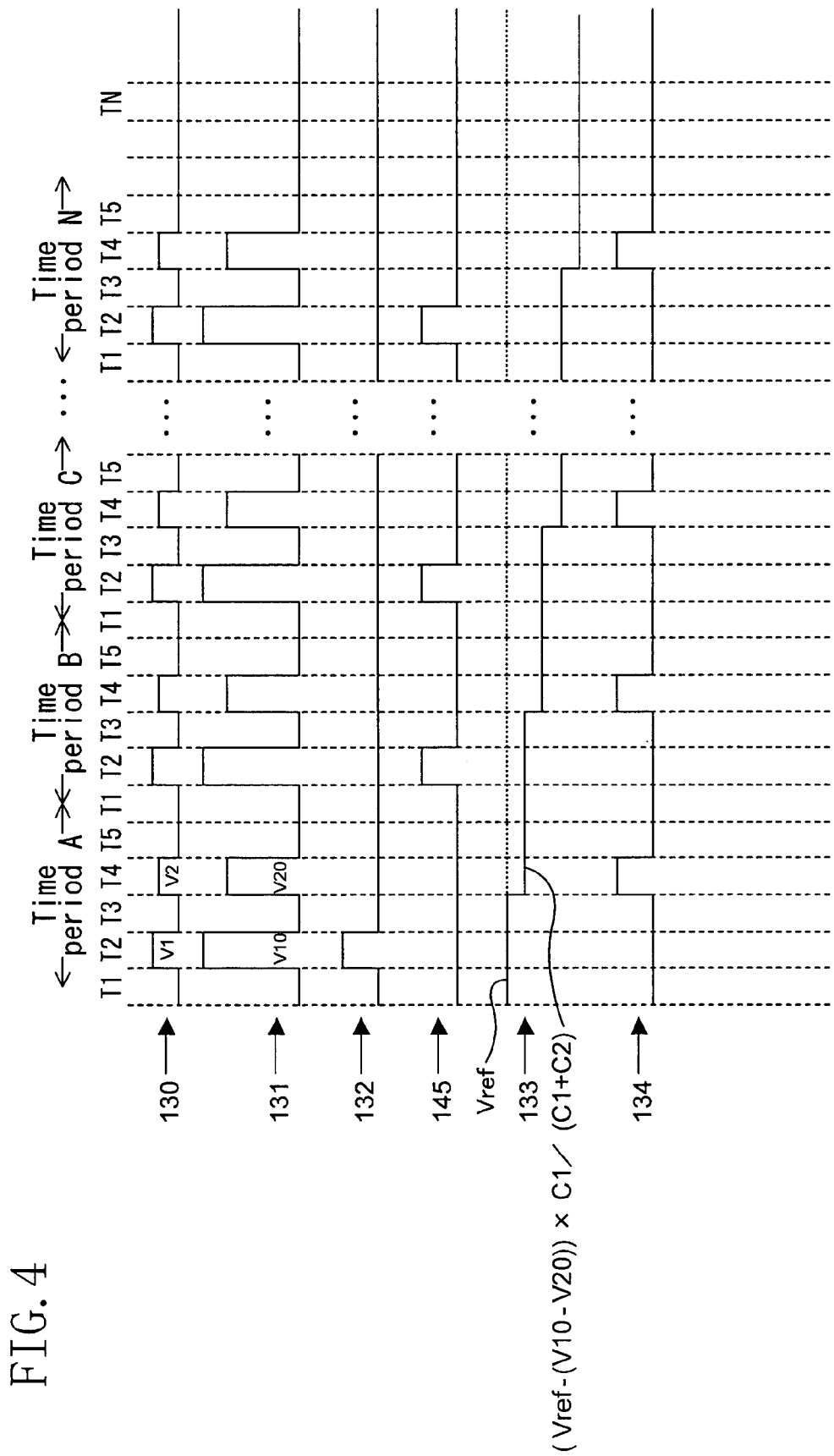
FIG. 4 shows timing for operating the noise reduction circuit according to the second embodiment of the present invention.

Hereinafter, it will be described how the noise reduction circuit of this embodiment operates. FIG. 4 shows timing for operating the noise reduction circuit of this embodiment. In FIG. 4, the reference numeral 130 represents the waveform of the signals output to the signal line 110; 131 represents the waveform of the signals (at the point A in FIG. 3) amplified by the amplifier circuit 111; 132 represents the waveform of a signal applied to the gate terminal 122 of the switch 114 (in this embodiment, this signal goes to the HIGH level only in a time period A); 145 represents the waveform of a signal applied to the gate terminal 142 of the switch 141 (in this embodiment, this signal goes to the HIGH level in each of the time periods B to N); 133 represents the waveform of the signals at the point B in FIG. 3; and 134 represents the waveform of a signal applied to the gate terminal 123 of the switch 115 (in this embodiment, this signal goes to the HIGH level in all of the time periods A to N).

As shown in FIG. 4, in the time period A, operation similar to that described in the first embodiment is performed. That is, first, in T2 in the time period A, the reference voltage V1 of a signal (a first signal) output to the signal line 110 is amplified to a voltage V10 by the amplifier circuit 111. At this time, since the gate terminal 122 of the switch 114 is at the HIGH level, the switch 114 is in the on state. Thus, the voltage at the point A is V10 and the voltage at the point B is Vref. Consequently, the capacitor 112 is charged with a voltage of (Vref−V10). Next, in T4 in the time period A, the detected voltage V2 of a signal (a second signal) output to the signal line 110 is amplified to a voltage V20 by the amplifier circuit 111, which causes the voltage at the point A to change from V10 to V20. At this time, since the gate terminal 123 of the switch 115 is at the HIGH level, the switch 115 is in the on state, and the capacitors 112 and 118 are electrically connected. Thus, the voltage at the point B is $$(Vref-(V10-V20)) \times (C1/(C1+C2))$$

where C1 is the capacitance value of the capacitor 112 and C2 is the capacitance value of the capacitor 118. As a result, an electric charge corresponding to that voltage is stored in the capacitor 118 in T5 in the time period A.

Next, in T2 in the time period B, the gate terminal 142 of the switch 141 (the signal 145) goes to the HIGH level, and the voltage (Vref−(V10−V20))×(C1/(C1+C2)) of the capacitor 118 is transmitted to the signal line 126 through the operational amplifier 140 and the on-state switch 141, and the transmitted voltage becomes a new reference voltage Vref'.

Subsequently, similar operation is repeated in the time periods B to N, whereby a voltage difference (containing noise) between the reference voltage V1 and the detected voltage V2 is added. In a case in which the number of times the voltage difference is added is N, the signal component of the signal output to the signal line 126 is N times the original signal component, while the noise therein is $N^{0.5}$ times the original signal noise. That is, the S/N ratio substantially increases by $N/N^{0.5}=N^{0.5}$ times. For instance, when N=100, the S/N ratio increases by 10 times.

As described above, according to the second embodiment, it is possible to substantially reduce the noise without any external memories.

What is claimed is:

1. A noise reduction circuit, which outputs a signal corresponding to a voltage difference between two different signals, the circuit comprising:
   an amplifier circuit for amplifying the two different signals at different timings; and
   a voltage difference detection circuit for detecting the voltage difference between the two different signals amplified by the amplifier circuit, wherein
   the noise reduction circuit accumulates, a predetermined number of times, an electric charge corresponding to the voltage difference detected by the voltage difference detection circuit and combines the accumulated electric charges to output a resultant electric charge.

* * * * *